(12) United States Patent
Jung et al.

(10) Patent No.: US 11,280,753 B2
(45) Date of Patent: Mar. 22, 2022

(54) SENSORS FOR DETECTING SUBSTITUTION BETWEEN CHEMICALS AND METHODS OF MANUFACTURING A SEMICONDUCTOR DEVICE USING THE SENSOR

(71) Applicants: Samsung Electronics Co., Ltd., Suwon-si (KR); SEMES Co., Ltd., Cheonan-si (KR)

(72) Inventors: Daesung Jung, Pohang-si (KR); Heehwan Kim, Sejong-si (KR); Jiyoung Lee, Asan-si (KR); Jongmin Song, Seoul (KR); Sangyoon Soh, Yongin-si (KR)

(73) Assignees: Samsung Electronics Co., Ltd.; SEMES CO., LTD.

( * ) Notice: Subject to any disclaimer, the term of this patent is extended or adjusted under 35 U.S.C. 154(b) by 220 days.

(21) Appl. No.: 16/781,039

(22) Filed: Feb. 4, 2020

(65) Prior Publication Data
US 2020/0386705 A1 Dec. 10, 2020

(30) Foreign Application Priority Data
Jun. 10, 2019 (KR) .......................... 10-2019-0067677

(51) Int. Cl.
*G01N 27/30* (2006.01)
*H01L 21/20* (2006.01)
(Continued)

(52) U.S. Cl.
CPC ......... *G01N 27/30* (2013.01); *H01L 21/2007* (2013.01); *G01N 27/60* (2013.01);
(Continued)

(58) Field of Classification Search
CPC ........ G01N 27/00; G01N 27/02; G01N 27/26; G01N 27/27; G01N 27/28; G01N 27/30;
(Continued)

(56) References Cited

U.S. PATENT DOCUMENTS 4,460,967 A 7/1984 Krull et al.
5,931,173 A 8/1999 Schiele
(Continued)

FOREIGN PATENT DOCUMENTS

JP 2000183005 6/2000
JP 3773390 5/2006
KR 20090056544 6/2009

*Primary Examiner* — Hoai-An D. Nguyen
(74) *Attorney, Agent, or Firm* — Myers Bigel, P.A.

(57) ABSTRACT

Sensors for detecting a substitution between chemicals may include an upper electrode and an electrical signal measurement circuit. A first chemical and a second chemical may be sequentially applied to the upper electrode. A triboelectrification may be generated between the upper electrode and the first and second chemicals to flow different electrical signals through the upper electrode. The electrical signal measurement circuit may measure the electrical signals to detect the substitution between the first and second chemicals. Thus, the second chemical may be applied to a semiconductor substrate from the substitution timing so that an original function of the second chemical may be maintained without a delay of the time for fabricating a semiconductor device.

20 Claims, 5 Drawing Sheets

(51) Int. Cl.
*H01L 21/67* (2006.01)
*G01N 27/60* (2006.01)
*G01R 19/00* (2006.01)
*H01L 21/66* (2006.01)

(52) U.S. Cl.
CPC .... *G01R 19/0092* (2013.01); *H01L 21/67075* (2013.01); *H01L 22/10* (2013.01)

(58) Field of Classification Search
CPC ......... G01N 27/60; H01L 21/00; H01L 21/02; H01L 21/04; H01L 21/18; H01L 21/20; H01L 21/2003; H01L 21/2007; H01L 21/67; H01L 21/67005; H01L 21/67017; H01L 21/67063; H01L 21/67075; H01L 21/67242; H01L 21/67253; H01L 22/00; H01L 22/10; H01L 22/14; G01R 19/00; G01R 19/0092
USPC .................................................. 324/452, 453
See application file for complete search history.

(56) References Cited

U.S. PATENT DOCUMENTS

| | | | |
|---|---|---|---|
| 6,351,132 B1 | 2/2002 | Park | |
| 6,767,747 B1 | 7/2004 | Bischoff et al. | |
| 8,933,697 B2 * | 1/2015 | Chen | ...................... A61B 5/055 |
| | | | 324/307 |
| 2004/0139985 A1 | 7/2004 | Hegedus et al. | |
| 2012/0227466 A1 | 9/2012 | Medlin et al. | |
| 2013/0154637 A1 * | 6/2013 | Chen | .................... G01R 33/485 |
| | | | 324/309 |

\* cited by examiner

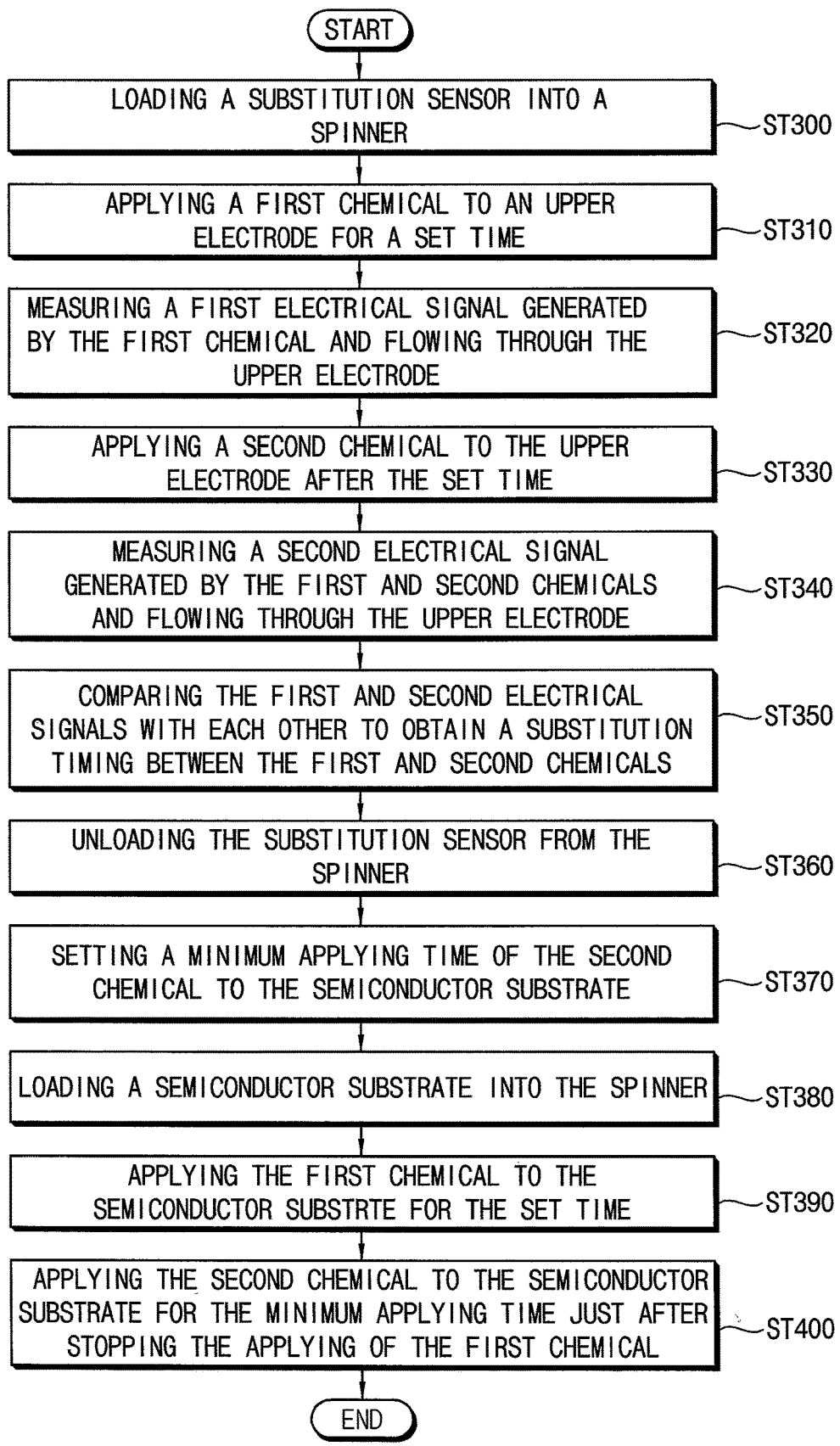

SENSORS FOR DETECTING SUBSTITUTION BETWEEN CHEMICALS AND METHODS OF MANUFACTURING A SEMICONDUCTOR DEVICE USING THE SENSOR

CROSS-RELATED APPLICATION

This application claims priority under 35 USC § 119 to Korean Patent Application No. 10-2019-0067677, filed on Jun. 10, 2019, in the Korean Intellectual Property Office (KIPO), the disclosure of which hereby incorporated by reference in its entirety.

FIELD

Example embodiments relate to sensors for detecting a substitution between chemicals and methods of manufacturing a semiconductor device using the same. More particularly, example embodiments relate to sensors for detecting a substitution between chemicals used for processing a semiconductor substrate, and methods of manufacturing a semiconductor device using the sensor.

BACKGROUND

Various chemicals may be used for manufacturing a semiconductor device. The chemicals may be sequentially applied to a semiconductor substrate to process the semiconductor substrate. The chemicals may have different properties. Thus, when partially mixed chemicals may be applied to the semiconductor substrate, each of the chemicals may not act an original function.

For example, after applying a first chemical to the semiconductor substrate, a second chemical may be applied to the semiconductor substrate during the first chemical may partially remain on the semiconductor substrate. An original function of the second chemical may not work due to the remaining first chemical on the semiconductor substrate. Thus, a substitution timing between the first chemical and the second chemical (i.e., a timing at which the first chemical may be completely removed from the semiconductor substrate) may be valuable information.

An applying timing of the second chemical may be set from database obtained by repeatedly performing semiconductor fabrication processes. However, the applying timing of the second chemical obtained by the above-mentioned manner may be inaccurate so that the second chemical may be applied before or after the substitution timing of the chemicals.

When the applying timing of the second chemical may be before the substitution timing of the chemicals, as mentioned above, the original function of the second chemical may not work due to the remaining first chemical on the semiconductor substrate. In contrast, when the applying timing of the second chemical may be after the substitution timing of the chemicals, a time for fabricating the semiconductor device may be increased, although the original function of the second chemical may be maintained.

SUMMARY

Example embodiments provide sensors for accurately detecting a substitution between chemicals.

Example embodiments also provide methods of manufacturing a semiconductor device using the sensor.

According to example embodiments, there may be provided sensors for detecting a substitution between chemicals. The sensors may include an upper electrode configured to generate electrical signals by sequentially contacting a first chemical and a second chemical by triboelectrification between the upper electrode and the first and second chemicals and configured to allow the electrical signals flow therethrough. The sensors may also include an electrical signal measurement circuit configured to measure the electrical signals to detect the substitution between the first chemical and the second chemical. The upper electrode may generate different signals corresponding to the first and second chemicals.

According to example embodiments, there may be provided sensors for detecting a substitution between chemicals. The sensor may include an upper electrode, an electrical signal measurement circuit, a lower electrode, a cover ring and a spinner. A first chemical and a second chemical may be sequentially applied to the upper electrode. The upper electrode may include silicon. A triboelectrification may be generated between the upper electrode and the first and second chemicals to flow different electrical signals through the upper electrode. In some embodiments, the upper electrode may be configured to sequentially contact a first chemical and a second chemical to generate triboelectrification between the silicon upper electrode and the first and second chemicals and configured to allow electrical signals flow therethrough. The electrical signal measurement circuit may be configured to measure the electrical signals to detect the substitution between the first and second chemicals. The lower electrode may be arranged under the upper electrode to form a space together with the upper electrode for receiving the electrical signal measurement circuit. In some embodiments, the electrical signal measurement circuit may be between the silicon upper electrode and the lower electrode. The cover ring may connect edge portions of the upper electrode and the lower electrode to protect the electrical signal measurement circuit. The spinner may rotate the lower electrode and the upper electrode to induce the first and second chemicals toward the edge portion of the upper electrode.

According to example embodiments, sensors may include a first electrode configured to generate electrical signals by sequentially contacting a first chemical and a second chemical. A central portion of the first electrode may be configured to initially contact the first chemical and the second chemical. The sensors may also include an electrical signal measurement circuit configured to measure the electrical signals generated from the first electrode, a second electrode, and a cover ring connecting edge portions of the first electrode and the second electrode. The electrical signal measurement circuit may be between the first electrode and the second electrode.

According to example embodiments, there may be provided methods of manufacturing a semiconductor device. In the methods of manufacturing the semiconductor device, a first chemical and a second chemical may be applied to an upper electrode of a substitution detection sensor. Electrical signals, which may be generated by a triboelectrification between the upper electrode and the first and second chemicals and may flow through the upper electrode, using an electrical signal measurement circuit of the substitution detection sensor may be measured to determine a substitution timing between the first chemical and the second chemical. The first chemical and the second chemical may be applied to a semiconductor substrate. The applying of the first and second chemicals to the semiconductor substrate may be controlled so that only the second chemical exists on the semiconductor substrate after the substitution timing. In some embodiments, the first and second chemicals may be applied to the semiconductor substrate to leave only the second chemical on the semiconductor substrate after the substitution timing.

In some embodiments, the method may further include setting a minimum applying time of the second chemical to the semiconductor substrate based on the substitution timing.

In some embodiments, the first and second chemicals may bee continuously applied to the semiconductor substrate. In some embodiments, the first and second chemicals may be sequentially applied to the semiconductor substrate without delay. The second chemical may be applied to the semiconductor substrate for the minimum applying time just after applying the first chemical is stopped.

In some embodiments, applying the second chemical to the semiconductor substrate may include applying the second chemical to the semiconductor substrate after the substitution timing.

According to example embodiments, the substitution detection sensor may accurately detect the substitution between the first chemical and the second chemical before fabricating the semiconductor device. Thus, the second chemical may be applied to the semiconductor substrate from the substitution timing so that an original function of the second chemical may be maintained with preventing a delay of the time for fabricating the semiconductor device.

Further, when the first and second chemicals may be sequentially applied to the semiconductor substrate without delay, the minimum optimal applying time of the second chemical to the semiconductor substrate may be set based on the substitution timing.

BRIEF DESCRIPTION OF THE DRAWINGS

Example embodiments will be more clearly understood from the following detailed description taken in conjunction with the accompanying drawings.

FIG. 1 is a perspective view illustrating a sensor for detecting a substitution between chemicals in accordance with example embodiments;

FIG. 2 is a cross-sectional view of the sensor in FIG. 1;

FIG. 3 is a cross-sectional view illustrating operations of an electrical signal measurement circuit of the sensor in FIG. 2;

FIG. 4 is a graph showing electrical signals, which are generated by an isopropyl alcohol (IPA), measured by the sensor in FIG. 2;

FIG. 5 is a graph showing electrical signals, which are generated by a deionized water (DIW) and an IPA, measured by the sensor in FIG. 2;

FIG. 6 is a flow chart illustrating a method of manufacturing a semiconductor device using the sensor in FIG. 2 in accordance with example embodiments; and FIG. 7 is a flow chart illustrating a method of manufacturing a semiconductor device using the sensor in FIG. 2 in accordance with example embodiments.

DETAILED DESCRIPTION

Hereinafter, example embodiments will be explained in detail with reference to the accompanying drawings.

Sensor for Detecting a Substitution Between Chemicals

Figure 1:
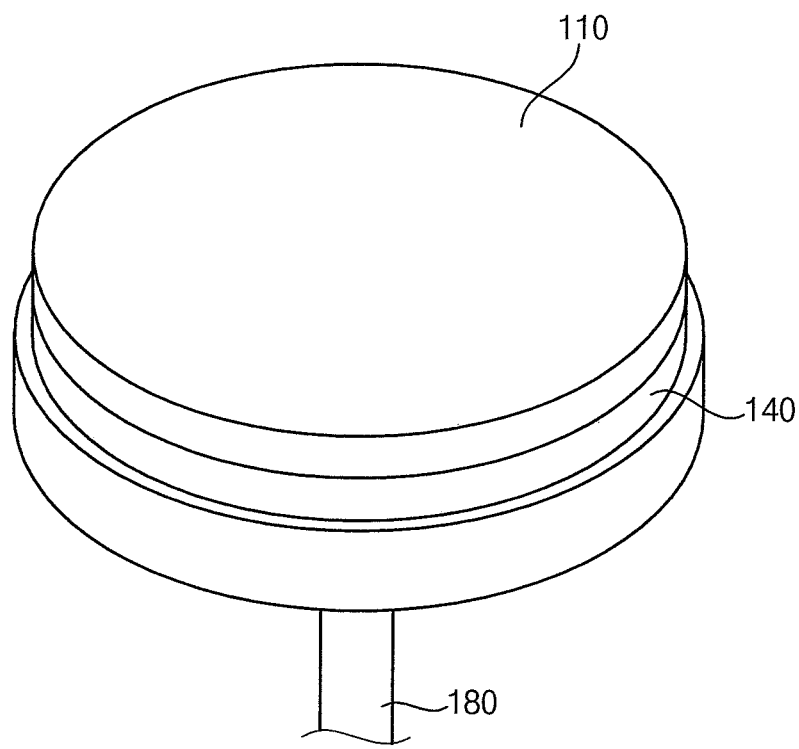
FIGS. 1 to 6 represent non-limiting, example embodiments as described herein.
Figure 2:
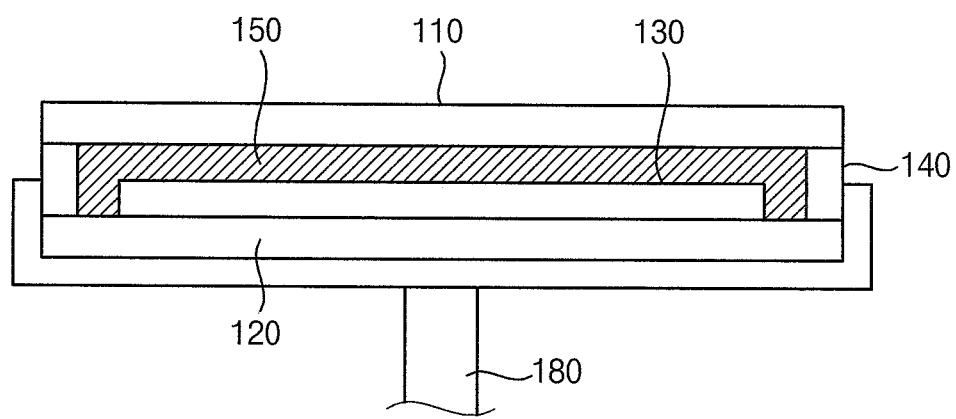
Figure 3:
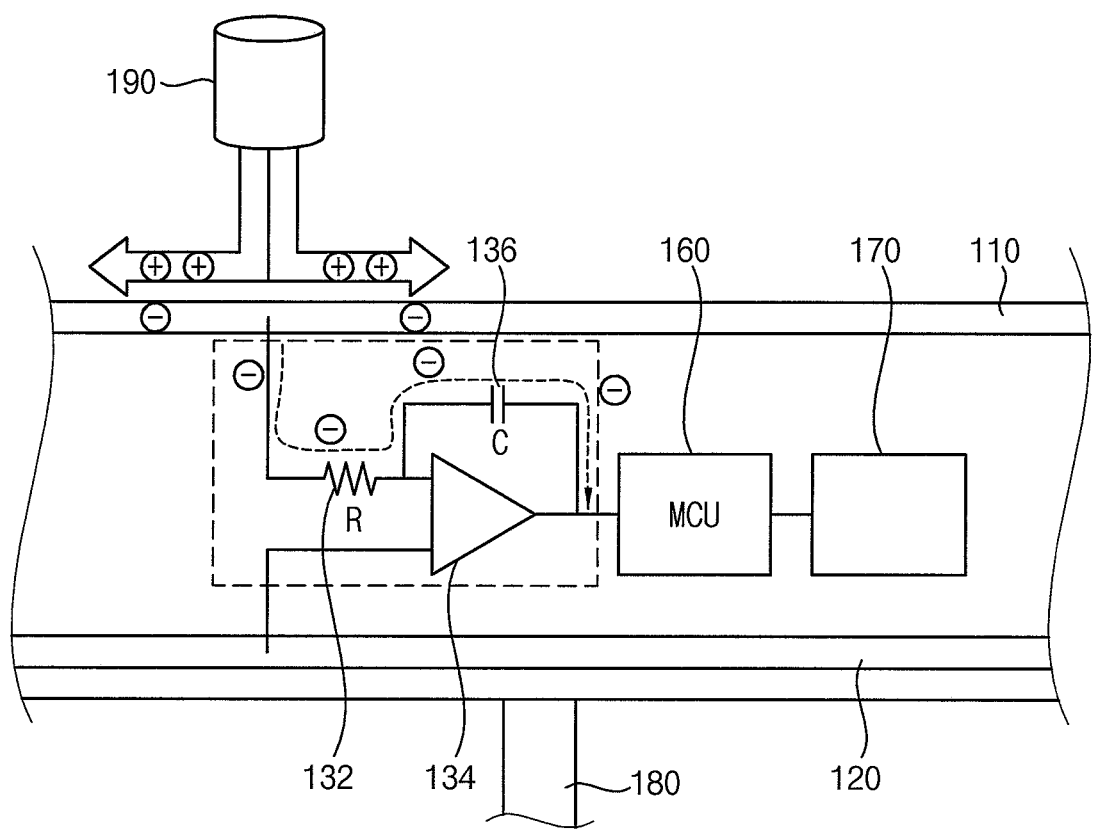

FIG. 1 is a perspective view illustrating a sensor for detecting a substitution between chemicals in accordance with example embodiments, FIG. 2 is a cross-sectional view of the sensor in FIG. 1, and FIG. 3 is a cross-sectional view illustrating operations of an electrical signal measurement circuit of the sensor in FIG. 2.

Referring to FIGS. 1 to 3, a substitution detection sensor between chemicals may detect a substitution timing between the chemicals used for manufacturing a semiconductor device, for example, between a first chemical and a second chemical. The substitution timing may correspond to a timing at which the first chemical applied to a semiconductor substrate may be completely removed from the semiconductor substrate. The second chemical may then be applied to the semiconductor substrate from the substitution timing. Thus, the substitution timing detected by the sensor may correspond to a timing at which the second chemical may be applied to the semiconductor substrate. In some embodiments, the substitution timing detected by the sensor may correspond to a timing at which the second chemical may be started to be applied to the semiconductor substrate. The substitution detection sensor may be used in place of the semiconductor substrate before performing semiconductor fabrication processes (e.g., actual semiconductor fabrication processes to form semiconductor devices on the semiconductor substrate) using at least the two chemicals. The substitution timing detected by the substitution detection sensor may be applied to the semiconductor fabrication processes. In some embodiments, the substitution timing detected by the substitution detection sensor may be used to determine process parameters (e.g., when the second chemical is started to be applied). The semiconductor substrate herein may refer to a substrate (e.g. a wafer) on which manufacturing processes are performed to fabricate integrated circuits (e.g., DRAM chips, NAND chips, CPU chips).

The substitution detection sensor having the above-mentioned functions may include an upper electrode 110, a lower electrode 120, an electrical signal measurement circuit 130, a cover ring 140, a filling material 150, a micro controller 160 and a communication module 170. The substitution detection sensor may detect the substitution timing by measuring electrical signals that may be generated by triboelectrification.

The upper electrode 110 may be arranged over the lower electrode 120. The upper electrode 110 may have a shape and a size substantially the same as those of the lower electrode 120. The lower electrode 120 may include a ground electrode.

The cover ring 140 may be configured to connect an edge portion of a lower surface of the upper electrode 110 with an edge portion of an upper surface of the lower electrode 120. A spinner 180 may be arranged under the lower electrode 120. The spinner 180 may be configured to support an outer surface of the substitution detection sensor. The spinner 180 may rotate the substitution detection sensor with respect to (e.g., around) a vertical axis. Thus, the chemical applied to a central portion of an upper surface of the upper electrode 110 may be induced to (e.g., moved to) an edge portion of the upper surface of the upper electrode 110. The spinner 180 may be a part of a semiconductor fabrication apparatus used for rotating the semiconductor substrate.

The upper electrode 110, the lower electrode 120 and the cover ring 140 may form an isolated internal space. The electrical signal measurement circuit 130, the micro controller 160 and the communication module 170 may be arranged in the internal space. The filling material 150 may be in the internal space. In some embodiments, the internal space may be partially or fully filled with the filling material 150. The filling material 150 may provide the electrical signal measurement circuit 130 with insulation, waterproof and/or chemical resistance. The filling material 150 may include various materials having the insulation, the waterproof and/or the chemical resistance. In some embodiments, the internal space may be an empty space.

The upper electrode 110 may be arranged under a nozzle 190 for injecting the chemicals. The nozzle 190 may be arranged over the central portion of the upper surface of the upper electrode 110. Thus, the nozzle 190 may inject the chemicals to the central portion of the upper surface of the upper electrode 110. The chemicals on the upper surface of the upper electrode 110 may flow from the central portion of the upper surface of the upper electrode 110 to the edge portion of the upper surface of the upper electrode 110 by the rotary force of the spinner 180. Particularly, because the chemicals may be provided to the central portion of the upper surface of the upper electrode 110, the chemicals may not make contact with other portions of the upper electrode 110 except for the upper surface of the upper electrode 110. The nozzle 190 may be a part of the semiconductor fabrication apparatus for processing the semiconductor substrate using the chemicals.

The chemical flowing to the edge portion from the central portion of the upper surface of the upper electrode 110 may generate a friction with the upper surface of the upper electrode 110 to charge the upper electrode 110. For example, when the chemical may have a positive electric charge, the upper electrode 110 may be negatively charged. Thus, an electrical signal may flow through the upper electrode 110. Further, the different chemicals may generate different electric charges by the friction between the chemicals and the upper surface of the upper electrode 110. Therefore, the electrical signals such as the electric charges, which may be generated by the different chemicals, flowing through the upper electrode 110 may be different from each other. In some embodiments, the upper electrode 110 may generate the electrical signal by contacting the chemical.

Because the upper electrode 110 may be charged by the chemicals, the upper electrode 110 may have a surface resistance with electrostatic conductivity. For example, the surface resistance of the upper electrode 110 may be no more than about $10^{10}\Omega$. A material having a surface resistance of about $10^{10}\Omega$ may not have electrical conductivity so that this material may not transmit a current to the electrical signal measurement circuit 130. Further, because the substitution detection sensor may be used in place of the semiconductor substrate before the semiconductor fabrication process, the upper electrode 110 to which the chemicals may be applied may have electrical characteristics similar to those of the semiconductor substrate. Thus, the upper electrode 110 may include a material substantially the same as that of the semiconductor substrate. For example, when the semiconductor substrate may include silicon, the upper electrode 110 may also include the silicon. In some embodiments, the upper electrode 110 may include a bare wafer. Further, the shape and the size of the upper electrode 110 may be substantially the same as those of the semiconductor substrate. For example, when the semiconductor substrate may have a circular shape, the upper electrode 110 may also have the circular shape. However, the shape of the upper electrode 110 may not be restricted within a specific shape. The upper electrode 110 may have other shapes, such as the circular shape.

The electrical signal measurement circuit 130 may measure the electrical signal such as a current, a charge, etc., flowing through the upper electrode 110. The electrical signal measurement circuit 130 may include a resistor 132, an amplifier 134, and a capacitor 136. The amplifier 134 may include an operational amplifier (op-amp). In some embodiments, the electrical signal measurement circuit 130 may include other elements for measuring the electrical signal as well as the above-mentioned configuration. That is, the electrical signal measurement circuit 130 may include various configurations for measuring the electrical signal.

The micro controller 160 may convert the electrical signals measured by the electrical signal measurement circuit 130 into signals. The communication module 170 may transmit the signals converted by the micro controller 160 to a terminal. The communication module 170 may transmit the signals to the terminal in wired communication or wireless communication. The signals transmitted to the terminal may be processed to form database. The substitution timing between the chemicals may be obtained based on the database in the terminal. Further, substituted amount between the chemicals may also be obtained based on the database in the terminal. The terminal may include a personal computer, a tablet, a smart phone, etc.

The semiconductor fabrication process using the at least two chemicals may include, for example, a cleaning process, a photo process, a wet etching process, etc. For example, the cleaning process may clean the semiconductor substrate using deionized water (DIW) and an isopropyl alcohol (IPA). Particularly, the DIW as the first chemical may be applied to the central portion of the upper surface of the rotating semiconductor substrate for a set time. After stopping the applying of the DIW, the IPA as the second chemical may then be applied to the central portion of the upper surface of the semiconductor substrate. Thus, the previously applied DIW may be gradually crowded out toward the edge portion of the upper surface of the semiconductor substrate by the IPA.

When an applying timing of the IPA may be before a substitution timing between the DIW and the IPA, the DIW may partially remain on the edge portion of the upper surface of the semiconductor substrate. Thus, the IPA applied to the semiconductor substrate may be mixed with the remaining DIW on the semiconductor substrate. As a result, the IPA mixed with the remaining DIW may not have a sufficient cleaning capacity. In contrast, when the applying timing of the IPA may be after the substitution timing between the DIW and the IPA, the DIW may be completely removed from the upper surface of the semiconductor substrate. Thus, the IPA may have the sufficient cleaning capacity. However, because the applying timing of the IPA may be set after the substitution timing between the DIW and the IPA, a cleaning time may be increased.

Figure 4:
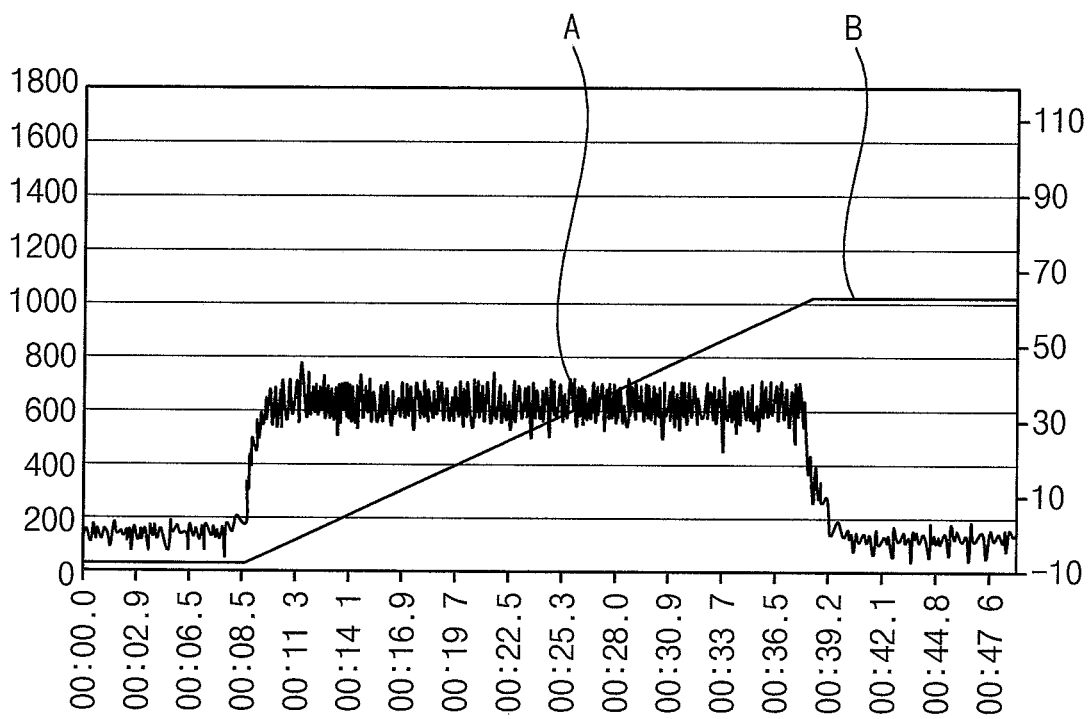
Figure 5:
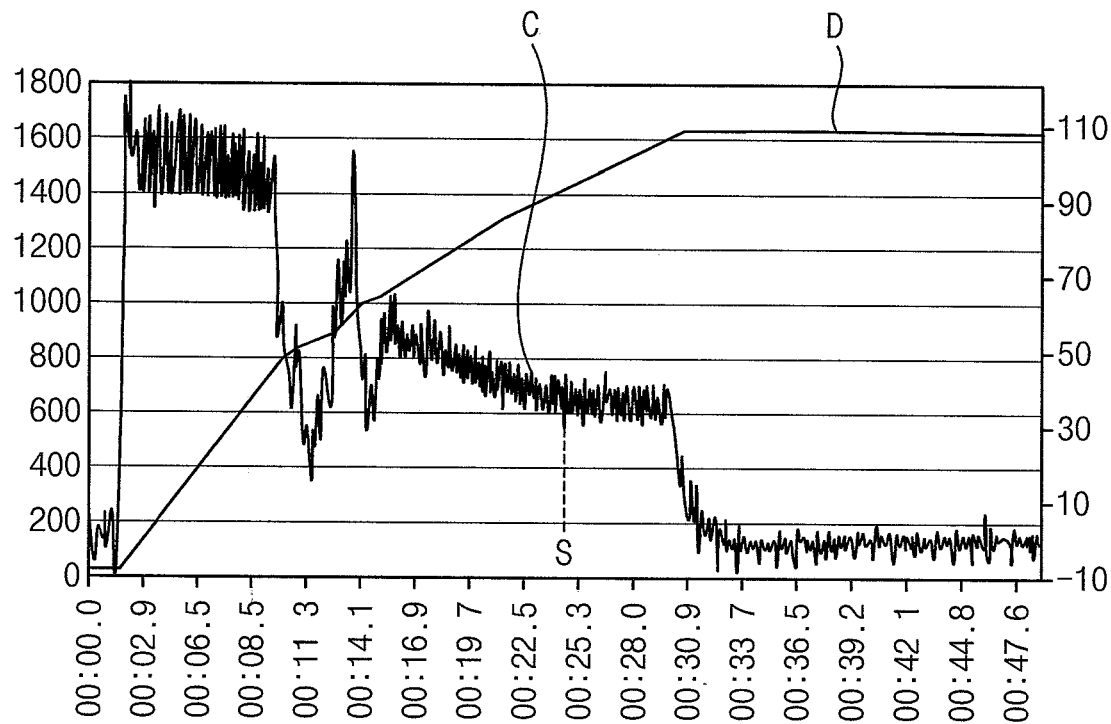

FIG. 4 is a graph showing electrical signals, which are generated by an IPA, measured by the sensor in FIG. 2, and FIG. 5 is a graph showing electrical signals, which are generated by an DIW and an IPA, measured by the sensor in FIG. 2.

In FIGS. 4 and 5, a horizontal axis represents a time, a left vertical axis represents a charge, and a right vertical axis may represent an electrical signal. In FIG. 4, a line A may indicate a current, and a line B may indicate the charge. In FIG. 5, a line C may indicate the current, and a line D may indicate the charge.

As shown in FIG. 4, when the IPA is provided to the central portion of the upper surface of the rotating upper electrode 110, the current may flow through the upper electrode 110. The current, which may be generated by only the IPA, measured by the electrical signal measurement circuit 130 may be about 35 nA.

As shown in FIG. 5, when the DIW is provided to the central portion of the upper surface of the rotating upper electrode 110, the current may flow through the upper electrode 110. The current, which may be generated by only the DIW, measured by the electrical signal measurement circuit 130 may be about 100 nA.

When the IPA is provided to the central portion of the upper surface of the rotating upper electrode 110 after stopping the providing of the DIW, the current may flow through the upper electrode 110. The generation of the current may be caused by the IPA and the DIA remaining on the upper electrode 110. Because the DIW may be crowded out toward the edge portion of the upper surface of the upper electrode 110 by the IPA, the current, which may be generated by the IPA and the DIW, measured by the electrical signal measurement circuit 130 may be gradually decreased and be then maintained at about 35 nA.

Because the current generated by only the IPA may be about 35 nA as shown in FIG. 4, a timing at which the current measured in FIG. 5 may be about 35 nA may correspond to the substitution timing S between the DIW and the IPA. That is, the DIW remaining on the upper electrode 110 may be completely removed from the upper surface of the upper electrode 110 at the substitution timing S. Thus, only the IPA may exist on the upper surface of the upper electrode 110 after the substitution timing S.

Therefore, the applying of the IPA to the upper surface of the semiconductor substrate may be set from the substitution timing S in the actual semiconductor fabrication process. As a result, only the IPA may clean the semiconductor substrate from the substitution timing S so that cleaning efficiency may be remarkably improved without increasing a cleaning time.

Further, when the DIW and the IPA may be continuously applied to (e.g., sequentially applied to without delay) the upper surface of the semiconductor substrate, a minimum applying time of the IPA may be set based on the substitution time. That is, a minimum applying amount of the IPA, which may sufficiently act on the semiconductor substrate, without increasing the cleaning time, may be set based on the substitution time so that the minimum applying time of the IPA to the semiconductor substrate may also be set. The minimum applying amount of the IPA to the semiconductor substrate may refer to an amount of the IPA that may be sufficient to clean the semiconductor substrate as required.

Method of Manufacturing a Semiconductor Device

Figure 6:
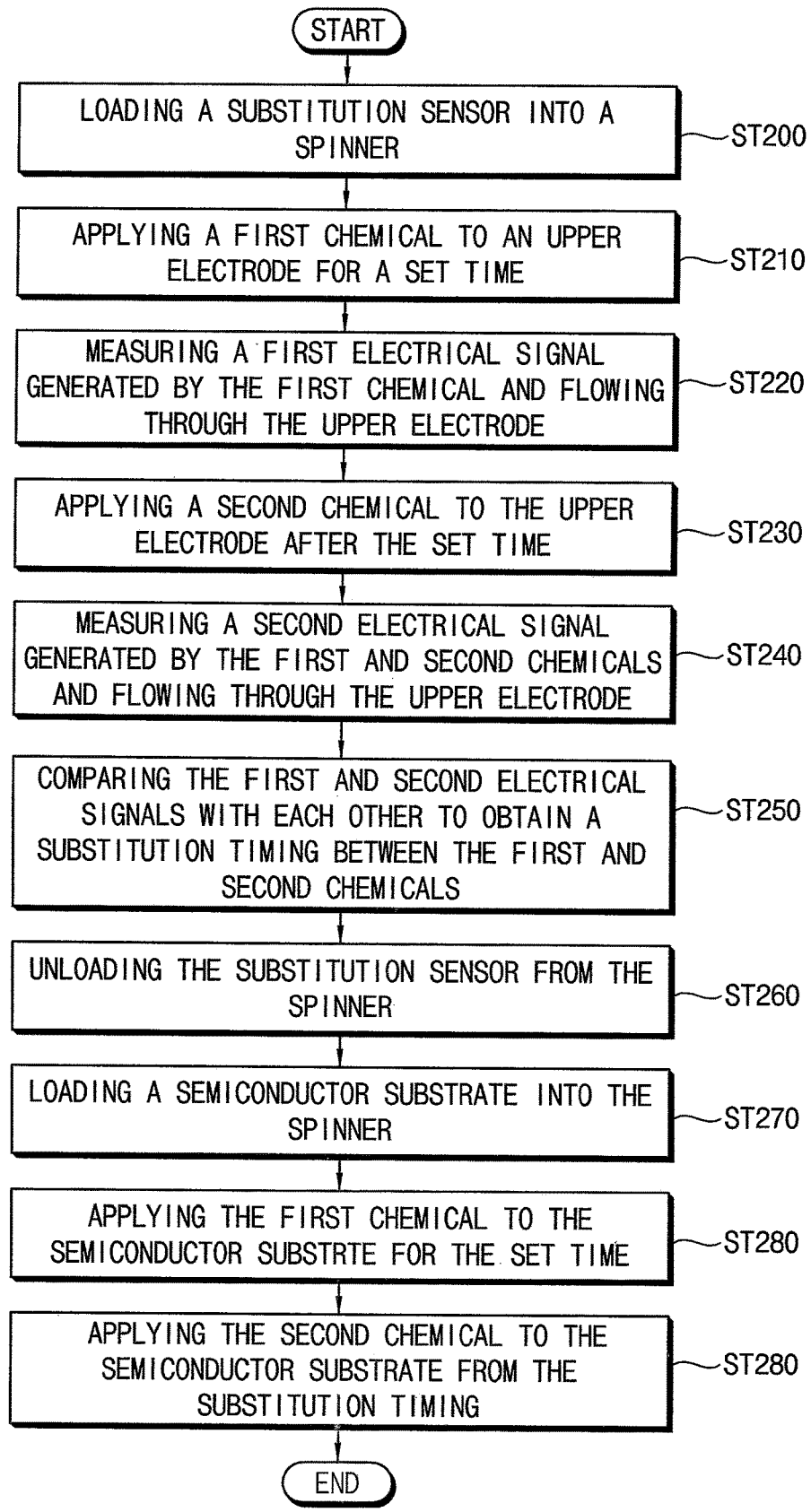

FIG. 6 is a flow chart illustrating a method of manufacturing a semiconductor device using the sensor in FIG. 2 in accordance with example embodiments.

Referring to FIGS. 2 and 6, in step ST200, the substitution detection sensor may be loaded into the spinner 180 before performing the semiconductor fabrication process. The spinner 180 may rotate the substitution detection sensor at a speed substantially the same as that set in the semiconductor fabrication process. Thus, the upper electrode 110 may be rotated at the speed substantially the same as that set in the semiconductor fabrication process.

In step ST210, the first chemical having a set amount may be applied to the central portion of the upper surface of the rotating upper electrode 110 for a set time. The set time and the set amount may be substantially the same as those of the first chemical set in the semiconductor fabrication process. After elapsing the set time, the applying of the first chemical may be stopped. The upper electrode 110 may be charged by the friction between the upper electrode 110 and the first chemical so that a first electrical signal may flow through the upper electrode 110.

In step ST220, the electrical signal measurement circuit 130 may measure the first electrical signal flowing through the upper electrode 110. The first electrical signal may be generated by only the first chemical. The micro controller 160 may process the first electrical signal measured by the electrical signal measurement circuit 130 to form or generate a signal. The communication module 170 may then transmit the signal to the terminal.

In step ST230, after elapsing the set time, the second chemical may be applied to the central portion of the upper surface of the rotating upper electrode 110. The second chemical may be applied to the central portion of the upper surface of the rotating upper electrode 110 just after the set time. That is, the first chemical and the second chemical may be continuously applied to the upper electrode without a time delay. In some embodiments, the first chemical and the second chemical may be sequentially applied to the upper electrode without delay. The previously applied first chemical may partially remain on the upper surface of the upper electrode 110. Thus, the upper electrode 110 may be charged by the friction between the upper electrode 110 and both the first and second chemicals so that a second electrical signal may flow through the upper electrode 110.

In step ST240, the electrical signal measurement circuit 130 may measure the second electrical signal flowing through the upper electrode 110. As mentioned above, the second electrical signal may be generated by both the first and second chemicals. Thus, the second electrical signal may be different from the first electrical signal. The micro controller 160 may process the second electrical signal measured by the electrical signal measurement circuit 130 to form or generate a signal. The communication module 170 may then transmit the signal to the terminal. In some embodiments, the spinner 180 may rotate the substitution detection sensor during the steps ST210, ST220, ST230, and ST240.

In step ST250, the first electrical signal and the second electrical signal in the terminal may be compared with each other to obtain or determine the substitution timing between the first chemical and the second chemical. Particularly, a value of an electrical signal, which may be generated by only the second chemical, flowing through the upper electrode 110 may be stored in the terminal. Because the first chemical may be gradually removed from the upper surface of the upper electrode 110 in proportion to the time elapse, a value of the first electrical signal may gradually approach to a value of the second electrical signal. A timing at which the value of the first electrical signal may be substantially the same as the value of the second electrical signal may be the substitution timing between the first chemical and the second chemical.

In step ST260, when the substitution timing between the first chemical and the second chemical may be obtained, the substitution detection sensor may be unloaded from the spinner 180.

In step ST270, the semiconductor substrate may be loaded into the spinner 180. The spinner 180 may rotate the semiconductor substrate at the speed set in the semiconductor fabrication process.

In step ST280, the first chemical having the set amount may be applied to the central portion of the upper surface of the rotating semiconductor substrate for the set time. After elapsing the set time, the applying of the first chemical may be stopped.

In step ST290, the second chemical may be applied to the central portion of the upper surface of the rotating semiconductor substrate at the substitution timing obtained by the substitution detection sensor. The first chemical remaining on the semiconductor substrate may be completely removed from the upper surface of the semiconductor substrate at the substitution timing. Thus, only the second chemical may exist on the upper surface of the semiconductor substrate after the substitution timing. As a result, only the second chemical may process the semiconductor substrate from the substitution timing so that cleaning efficiency may be remarkably improved without increasing a cleaning time.

FIG. 7 is a flow chart illustrating a method of manufacturing a semiconductor device using the sensor in FIG. 2 in accordance with example embodiments.

Referring to FIGS. 2 and 7, in step ST300, the substitution detection sensor may be loaded into the spinner 180 before performing the semiconductor fabrication process. The spinner 180 may rotate the substitution detection sensor at a speed substantially the same as that set in the semiconductor fabrication process. Thus, the upper electrode 110 may be rotated at the speed substantially the same as that set in the semiconductor fabrication process.

In step ST310, the first chemical having a set amount may be applied to the central portion of the upper surface of the rotating upper electrode 110 for a set time. The set time and the set amount may be substantially the same as those of the first chemical set in the semiconductor fabrication process. After elapsing the set time, the applying of the first chemical may be stopped. The upper electrode 110 may be charged by the friction between the upper electrode 110 and the first chemical so that a first electrical signal may flow through the upper electrode 110.

In step ST320, the electrical signal measurement circuit 130 may measure the first electrical signal flowing through the upper electrode 110. The first electrical signal may be generated by only the first chemical. The micro controller 160 may process the first electrical signal measured by the electrical signal measurement circuit 130 to form or generate a signal. The communication module 170 may then transmit the signal to the terminal.

In step ST330, after elapsing the set time, the second chemical may be applied to the central portion of the upper surface of the rotating upper electrode 110. The second chemical may be applied to the central portion of the upper surface of the rotating upper electrode 110 just after the set time. That is, the first chemical and the second chemical may be continuously applied to the upper electrode without a time delay. In some embodiments, the first chemical and the second chemical may be sequentially applied to the upper electrode without delay. The previously applied first chemical may partially remain on the upper surface of the upper electrode 110. Thus, the upper electrode 110 may be charged by the friction between the upper electrode 110 and both the first and second chemicals so that a second electrical signal may flow through the upper electrode 110.

In step ST340, the electrical signal measurement circuit 130 may measure the second electrical signal flowing through the upper electrode 110. As mentioned above, the second electrical signal may be generated by both the first and second chemicals. Thus, the second electrical signal may be different from the first electrical signal. The micro controller 160 may process the second electrical signal measured by the electrical signal measurement circuit 130 to form or generate a signal. The communication module 170 may then transmit the signal to the terminal. In some embodiments, the spinner 180 may rotate the substitution detection sensor during the steps ST310, ST320, ST330, and ST340.

In step ST350, the first electrical signal and the second electrical signal in the terminal may be compared with each other to obtain or determine the substitution timing between the first chemical and the second chemical. Particularly, a value of an electrical signal, which may be generated by only the second chemical, flowing through the upper electrode 110 may be stored in the terminal. Because the first chemical may be gradually removed from the upper surface of the upper electrode 110 in proportion to the time elapse, a value of the first electrical signal may gradually approach to a value of the second electrical signal. A timing at which the value of the first electrical signal may be substantially the same as the value of the second electrical signal may be the substitution timing between the first chemical and the second chemical.

In step ST360, when the substitution timing between the first chemical and the second chemical may be obtained, the substitution detection sensor may be unloaded from the spinner 180.

In step ST370, a minimum applying time of the second chemical to the semiconductor substrate may be set. Particularly, when the first and second chemicals may be continuously applied (e.g., sequentially applied to without delay) to the semiconductor substrate, the minimum applying time of the second chemical may be set based on the substitution timing. A applying speed of the second chemical to the semiconductor substrate may be predetermined. Further, an applying amount of the second chemical to the semiconductor substrate, which may sufficiently act on the semiconductor substrate, without increasing a fabrication time, may be set based on the substitution timing. Therefore, the minimum applying time of the second chemical to the semiconductor substrate may be set. The applying amount of the second chemical to the semiconductor substrate may refer to an amount of the second chemical that may be sufficient to process (e.g., clean) the semiconductor substrate as required.

In step ST380, the semiconductor substrate may be loaded into the spinner 180. The spinner 180 may rotate the semiconductor substrate at the speed set in the semiconductor fabrication process.

In step ST390, the first chemical having the set amount may be applied to the central portion of the upper surface of the rotating semiconductor substrate for the set time. After elapsing the set time, the applying of the first chemical may be stopped.

In step ST400, the second chemical may be applied to the central portion of the upper surface of the rotating semiconductor substrate just after stopping the applying of the first chemical. Particularly, the second chemical may be applied to the central portion of the upper surface of the rotating semiconductor substrate for the minimum applying time set in step ST370.

Therefore, the second chemical with the sufficient amount may be applied to the semiconductor substrate during the minimum applying time so that cleaning efficiency may be remarkably improved without increasing a cleaning time.

The process using the method of example embodiments may include, for example, a cleaning process, a photo process, a wet etching process, etc., using the at least two chemicals. As mentioned above, the cleaning process may clean the semiconductor substrate using the at least two chemicals such as the DIW and the IPA. The photo process may form a pattern from a layer on the semiconductor substrate using the at least two chemicals such as a photoresist, a developing solution, etc. The wet etching process may etch a layer on the semiconductor substrate using the at least two chemicals such as two etching solutions (e.g. two etchants). Further, the process using the method of example embodiments may include other semiconductor fabrication processes using at least two chemicals as well as the cleaning process, the photo process and the wet etching process.

In example embodiments, the substitution detection sensor may detect the substitution timing between the two chemicals. In some embodiments, the substitution detection sensor may detect substitution timings between at least three chemicals. For example, the substitution detection sensor may detect a substitution timing between the second chemical and a third chemical.

According to example embodiments, the substitution detection sensor may accurately detect the substitution between the first chemical and the second chemical before fabricating the semiconductor device. Thus, the second chemical may be applied to the semiconductor substrate from the substitution timing so that an original function of the second chemical may be maintained without a delay of the time for fabricating the semiconductor device.

Further, when the first and second chemicals may be continuously applied to (e.g., sequentially applied to without delay) the semiconductor substrate, a minimum applying time of the second chemical to the semiconductor substrate may be set based on the substitution timing.

The foregoing description is to be considered illustrative and not restrictive, and the appended claims are intended to cover all such modifications, enhancements, and other embodiments, which fall within the scope of the inventive concept. Those skilled in the art will appreciate that many modifications are possible in the example embodiments without materially departing from the present invention.

What is claimed is:

1. A sensor for detecting a substitution between chemicals, the sensor comprising:
    an upper electrode configured to generate electrical signals by sequentially contacting a first chemical and a second chemical by triboelectrification between the upper electrode and the first and second chemicals and configured to allow the electrical signals flow therethrough; and
    an electrical signal measurement circuit configured to measure the electrical signals to detect the substitution between the first chemical and the second chemical.

2. The sensor of claim 1, wherein a central portion of the upper electrode is configured to initially contact the first chemical and the second chemical.

3. The sensor of claim 2, wherein the upper electrode comprises a first surface configured to contact the first chemical and the second chemical and a second surface opposite the first surface, and
    wherein the electrical signal measurement circuit faces the second surface of the upper electrode.

4. The sensor of claim 1, wherein the upper electrode comprises a material substantially the same as a material of a semiconductor substrate.

5. The sensor of claim 4, wherein the material of the upper electrode comprises silicon.

6. The sensor of claim 5, wherein the upper electrode comprises a bare wafer.

7. The sensor of claim 1, wherein the upper electrode has a shape and a size substantially the same as a shape and a size of a semiconductor substrate.

8. The sensor of claim 1, further comprising a lower electrode, wherein the electrical signal measurement circuit is between the upper electrode and the lower electrode.

9. The sensor of claim 8, further comprising a cover ring connecting edge portions of the upper electrode and the lower electrode to protect the electrical signal measurement circuit.

10. The sensor of claim 9, further comprising a filling material partially filling a space defined by the upper electrode, the lower electrode, and the cover ring.

11. The sensor of claim 1, further comprising a micro controller configured to process the electrical signals measured by the electrical signal measurement circuit to generate signals.

12. The sensor of claim 11, further comprising a communication module configured to transmit the signals to a terminal.

13. A sensor for detecting a substitution between chemicals, the sensor comprising:
    a silicon upper electrode configured to sequentially contact a first chemical and a second chemical to generate triboelectrification between the silicon upper electrode and the first and second chemicals and configured to allow electrical signals flow therethrough;
    an electrical signal measurement circuit configured to measure the electrical signals to detect the substitution between the first chemical and the second chemical;
    a lower electrode, the electrical signal measurement circuit being between the silicon upper electrode and the lower electrode; and
    a cover ring connecting edge portions of the silicon upper electrode and the lower electrode to protect the electrical signal measurement circuit.

14. The sensor of claim 13, further comprising a micro controller configured to process the electrical signals measured by the electrical signal measurement circuit to generate signals.

15. The sensor of claim 14, further comprising a communication module configured to transmit the signals to a terminal.

16. A method of manufacturing a semiconductor device, the method comprising:
    applying a first chemical and a second chemical to an upper electrode of a substitution detection sensor;
    determining a substitution timing between the first chemical and the second chemical by measuring electrical signals, which are generated by a triboelectrification between the upper electrode and the first and second chemicals and flow through the upper electrode, using an electrical signal measurement circuit of the substitution detection sensor; and
    applying the first chemical and the second chemical to a semiconductor substrate,
    wherein the applying of the first and second chemicals to the semiconductor substrate comprises applying the first and second chemicals to leave only the second chemical on the semiconductor substrate after the substitution timing.

17. The method of claim 16, further comprising setting a minimum applying time of the second chemical to the semiconductor substrate based on the substitution timing.

18. The method of claim 17, wherein applying the first chemical and the second chemical to the semiconductor substrate comprises sequentially applying the first and second chemicals to the semiconductor substrate without delay, and the second chemical is applied to the semiconductor substrate for the minimum applying time just after applying the first chemical is stopped.

19. The method of claim 16, wherein applying the first chemical and the second chemical to the semiconductor substrate comprises applying the second chemical to the semiconductor substrate after the substitution timing.

20. The method of claim 16, wherein applying the first and second chemicals to the upper electrode comprises applying the first and second chemicals to a central portion of an upper surface of the upper electrode with rotating the upper electrode.

\* \* \* \* \*